United States Patent [19]
Berger

[11] 3,932,882
[45] Jan. 13, 1976

[54] CHARGE TRANSFER DEVICE

[75] Inventor: Josef Berger, Sunnyvale, Calif.

[73] Assignee: Hewlett-Packard Company, Palo Alto, Calif.

[22] Filed: Oct. 24, 1974

[21] Appl. No.: 517,717

Related U.S. Application Data

[63] Continuation of Ser. No. 370,887, June 18, 1973, abandoned.

[52] U.S. Cl. ................................................. 357/24
[51] Int. Cl.² ........................................... H01L 29/78
[58] Field of Search ..................................... 357/24

[56] References Cited
OTHER PUBLICATIONS

IBM (Tech Bul.) — Heller et al., Vol. 14, No. 2, July 1971 "Random Access Potential Ramp Memory for Charge Coupled Devices".
IBM (Tech. Bul.) — Patrin, Vol. 14, No. 1, June 1971 "Minority Charge Detector".
IBM (Tech. Bul.) — Anantha et al., Vol. 14, No. 4, Sept. 1971 "Unidirectional Charge-Coupled Shift Register".
IBM (Tech. Bul.) — Vol. 13, No. 11, Apr. 1971 "Ramp Potential Mis Device".

Primary Examiner—Stanley D. Miller, Jr.
Assistant Examiner—E. Wojciechowicz
Attorney, Agent, or Firm—Ronald E. Grubman

[57] ABSTRACT

A two-phase semiconductor charge transfer device is constructed using electrodes which include both a highly resistive region and a highly conductive region. An array of such electrodes is overlayed on an insulating layer which has been deposited onto a semiconductor substrate. Alternate phases of an applied two-phase voltage source are applied to alternate electrodes in the array, thereby generating an electrical potential distribution in the semiconductor. Charge, in the form of minority carriers in the semiconductor, is stored in the minima of the potential distribution. When the voltage phases are pulsed, the potential in the regions beneath the highly conductive parts of the electrodes almost instantaneously changes value. However, in the regions beneath the highly resistive parts of the electrodes, the potential changes value much more slowly. As the potential varies, charge is transferred from the region under one electrode to the region under an adjacent electrode. The slower variation in the potential under the resistive regions provides a "potential shoulder" which prevents backward spilling of the charge in an undesired direction. Thus, directionality is imparted to the charge transfer.

6 Claims, 4 Drawing Figures

CHARGE TRANSFER DEVICE

CROSS REFERENCE TO RELATED APPLICATION

This is a continuation of application Ser. No. 370,887, filed June 18, 1973, now abandoned.

BACKGROUND AND SUMMARY OF THE INVENTION

Charge transfer devices are semiconductor devices which operate to store clumps of charge in localized regions of a semiconductor and to transfer the stored charge systematically from one region to another. A typical MOS charge transfer device consists of an array of metal electrodes overlayed on a dielectric layer which is itself deposited on a semiconductor substrate. The device operates by storing minority carriers in the semiconductor in localized regions under certain ones of the metal electrodes. In one type of device, commonly called an interface device, the charge is stored at the boundary between the oxide and the semiconductor substrate. In another type of device, called a bulk device, the stored charge is instead distributed in the semiconductor to some distance below the oxide-semiconductor interface. In both cases, the charge is localized by applying external voltages to the electrodes to create potential minima (potential wells) in the vicinity of the electrodes. By suitably varying the voltages on the different electrodes, the potential minima can be moved from one electrode to the next, thereby inducing a transfer of the stored charge from one region to another.

One potential application of these charge transfer devices is in the area of image sensing; minority carries are generated in the semiconductor in response to incident light, the charge thus generated being collected under the electrodes and transferred to a detector. Another potential application is to use the transfer device as an electronic delay line. Yet another potential application is to use charge transfer devices in a shift register mode to form a semiconductor computer memory. Each clump of stored charge (or the absence thereof) represents one bit of information.

For all of these applications, and especially for use as a computer memory, it is important that the charge transfer efficiency be very high. That is, when charge is transferred from the region beneath one electrode to the region beneath an adjacent electrode, a very large fraction (for example 99.9%) of the charge should be transferred. Otherwise, charge which is left behind will be subtracted from the charge comprising the transferred information bit, and added to the charge comprising the next adjacent bit. After a large number of transfers, the information in both bits will have been substantially degraded.

One of the ways known in the prior art to achieve efficient transfer is to employ a three-phase device in which every third electrode is connected in common. To store charge, external voltages are applied to the electrodes to create a deep potential well beneath every third electrode. Minority carriers in the semiconductor will be trapped and temporarily stored in these regions. To effect a transfer of charge, external voltages are applied to the electrodes in a three-phase timed sequence according to which another, deeper, potential well is created beneath the electrodes adjacent on one side to those electrodes under which charge may be currently stored. Under the influence of this deeper potential well, the charge stored under particular electrodes will be transferred to the regions beneath the above-mentioned adjacent electrodes. At the same time, the three-phase voltage operates to establish a very shallow potential well under the electrodes adjacent on the other side to those under which the charge (if any) was initially stored. This potential acts as a barrier to prevent charge from "spilling backwards." Thus, the three-phase structure serves to provide directionality to the charge transfer.

However, it is often desirable to provide directionality to the charge transfer without the complexities inherent in a three-phase system. This has been accomplished in the prior art by using a two-phase sytem in which external voltages are applied to the electrodes in a two-phase timed sequence beneath each electrode. Directionality of the charge transfer is provided by making the oxide layer non-uniform. In particular, if the oxide is thicker under one side of the electrode than the other, the variation in dielectric thickness will produce a variation in the potential strength under the electrode, so that the charge will be stored preferentially under one side of the electrode. To effect a charge transfer, the voltages on adjacent plates are pulsed to decrease the depth of the potential wells in which charge (if any) is currently stored, while simultaneously increasing the depth of the potential wells under the adjacent electrodes. Charge which was initially stored in the "deep" potential well (now "shallow") will be transferred to the adjacent potential well which is now "deep." FIGS. 1A–1B illustrate how the potential variation under each plate (caused by the non-uniform thickness of the oxide layer) acts to provide directionality to the charge transfer and thus prevent charge from slipping backwards. FIG. 1A shows the configuration of such a variable-thickness two-phase device in the storage mode. A voltage $-V_1$ is applied to all of the odd-numbered electrodes, while another voltage $-V_2$ (where $V_2 > V_1$) is applied to the even-numbered electrodes. In this configuration, charge can be stored under any of the even-numbered electrodes. An oxide layer 5 is thicker under the left side of each electrode than under the right side, so that the potential well is deeper under the right side than under the left side of these electrodes. Charge will thus be stored under the right side. For example, in the figure, charge is stored under the right side of electrode 2 (representing a "1" bit of information), while no charge is stored under electrode 4 (representing a "o" bit of information). FIG. 1B shows the configuration of the device after the two-phase voltages on adjacent electrodes have been exchanged. The arrows indicate that the potential wells under the odd-numbered electrodes have increased in depth while those under the even-numbered electrodes have decreased in depth. Thus, the charge that was formally stored under electrode 2 will be spilled forward into the potential well under electrode 3. However, since the relative depths of the potential wells under the two halves of electrode are decreased in tandem, there will at all times be a "potential shoulder" under the left side of the electrode 2 which will prevent charge from slipping backwards to the region under electrode 1. In practice, it is difficult to design and manufacture multiple oxide thickness devices which achieve efficient charge transfer. Typically, for efficient transfer, one of the oxide thicknesses must be very much greater than the other, for example, thicknesses in the ratio of about 1:3 to 1:5.

Furthermore, in order to manufacture the device, two separate steps are required to grow and etch the two oxide layers. Thus, it is often a complicated and expensive procedure to provide charge transfer directionality through the design and fabrication of multi-level oxide devices.

In accordance with the illustrated preferred embodiment, the present invention provides a two-phase charge transfer device using an array of electrodes overlayed on an insulating layer which is deposited on a semiconductor substrate. Directionality of the charge transfer is built-in by using electrodes which include a highly conductive part and another highly resistive part. When a two-phase voltage applied to the electrodes changes phase, the potential under the conductive part of each electrode follows almost instantaneously. But the resistive part of each electrode acts in conjunction with the oxide insulating layer as a distributed RC line which slows the rate of change of the potential in the region beneath the resistive part of the electrode. In effect, then, a single phase change in the voltage applied to each electrode generates an instantaneous change in one part of the potential well under that electrode, and also a delayed change in another part of that potential well. If the geometry is suitably chosen, the potential wells under adjacent electrodes will vary in such a way that charge is dumped from the region under one electrode to the region under the next adjacent electrode. The delayed change in part of the potential well creates a barrier which prevents charge from slipping backwards.

Another feature of the invention is that the charge transfer is self-correcting for losses of charge that occur when charge is transferred too rapidly into a region. In particular, the charge transfer frequency is dependent almost entirely on the RC time constant of the distributed RC line and not on the external clock frequency. Thus, when there is no charge in the region into which charge is to be transferred, the capacity (and hence the RC time constant) is small and the potential well changes rapidly, thereby inducing a rapid transfer of charge into the region. But, as charge builds up in the region, the capacity increases so that the shape of the potential well changes less rapidly. The rate of transfer of charge into the region is thus reduced. The rate of transfer of charge into the region is thus reduced. This self-correcting process ensures that charge will not be transferred into a previously charged region at a rate high enough to cause loss of charge. The efficiency of the devices is thereby increased.

It can be seen that the directionality of the charge transfer is achieved in the invention using only a single oxide layer of a uniform thickness. Since the resistivity of the electrodes can be varied by implanting impurity ions in the resitive layer, there is no additional masking step required during fabrication as is required in devices achieving directionality using a non-uniform oxide thickness.

DESCRIPTION OF THE INVENTION

Figure 1A:
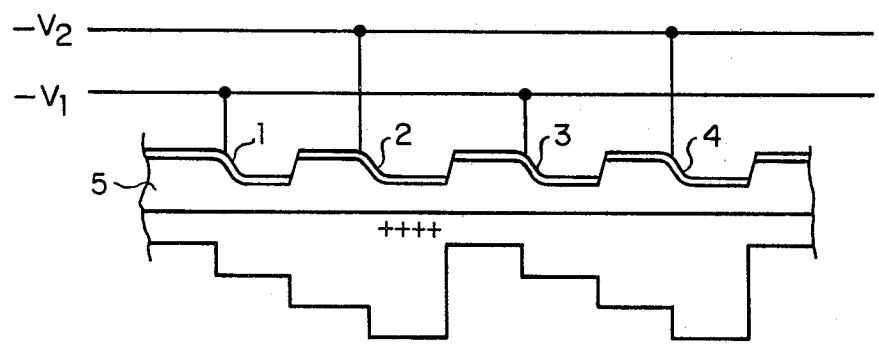
FIGS. 1A and 1B illustrate a two-phase charge transfer device known in the prior art.
Figure 1B:
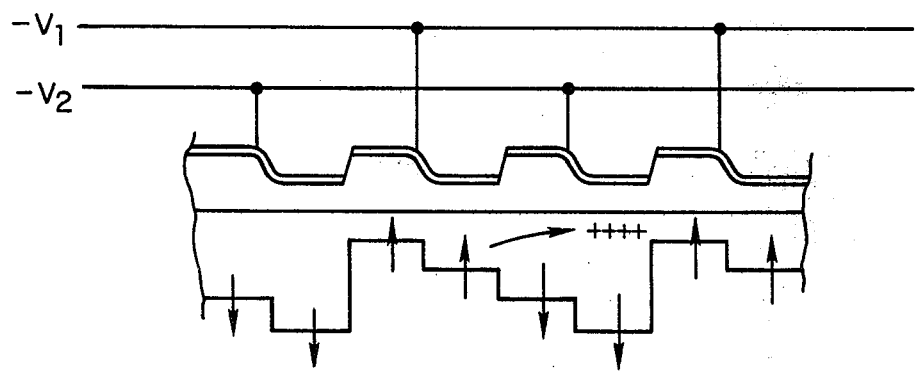
Figure 2A:
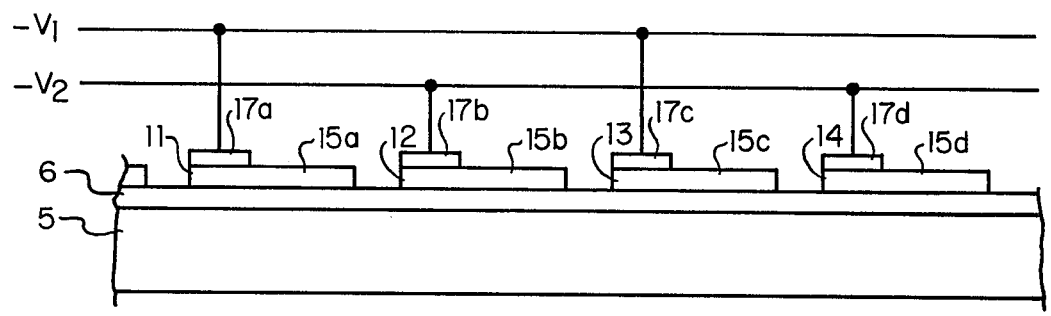
FIG. 2A shows a cross-sectional view of a portion of a two-phase charge transfer device using electrodes with a highly conductive region and a highly resistive region.

In FIG. 2A there is shown a substrate 5 of a semiconductor material, e.g. Si, or GaAs, or GaP. Deposited onto the substrate 5 is an insulating layer 6 of a dielectric material, e.g. $SiO_2$, or $Si_3N_4$, or $Al_2O_3$. Overlayed on the insulating layer 6 is an array of electrodes, four of which are shown and labeled 11, 12, 13 and 14. Each electrode includes two distinct regions. One region, shown in the illustrated embodiment as being directly overlayed on the oxide layer 6, is a highly resistive region. In the figure this highly resistive region is labeled 15a, 15b, 15c and 15d for the four electrodes 11, 12, 13, and 14 respectively. Typical values of the resistivity are in the range 0.1–100 MΩ/square which may be obtained by using materials such as polysilicon or a thin metal layer (e.g. thicknesses of about a few thousand Angstroms). Typical dimensions of the highly resistive region are e.g. 5μm by 10μm. Overlayed on a portion of each of the resistive regions 15a–15d is a highly conductive region, numbered 17a, 17b, 17c, 17d for the four electrodes 11, 12, 13, 14 respectively. Typical values of the conductivity are e.g. in the range 1–5μ which may be obtained by using materials such as Al, or MoAu, or PtTi. Typical dimensions of the highly conductive region are e.g. 2μm x 10m. By using electrodes including both a highly conductive region and a highly resistive region, each electrode in effect becomes a part of a distributed RC network, the resistance being supplied by the highly resistive region of the electrode, and the capacitance being supplied by the oxide-semiconductor interface. The spacing between the electrodes must be small enough to allow efficient charge transfer from the region under one electrode to the region under the next adjacent electrode, for example in the range of about 1–3μm. Also illustrated in FIG. 2A is a two-phase voltage system including two voltage lines shown as providing voltages $-V_1$ and $-V_2$. The voltage $-V_1$ is applied to electrodes 11 and 13 and also to all other odd-numbered electrodes in the array, while the voltage $-V_2$ is supplied to the electrodes 12 and 14 and also to all other even-numbered electrodes in the array.

Figure 2B:
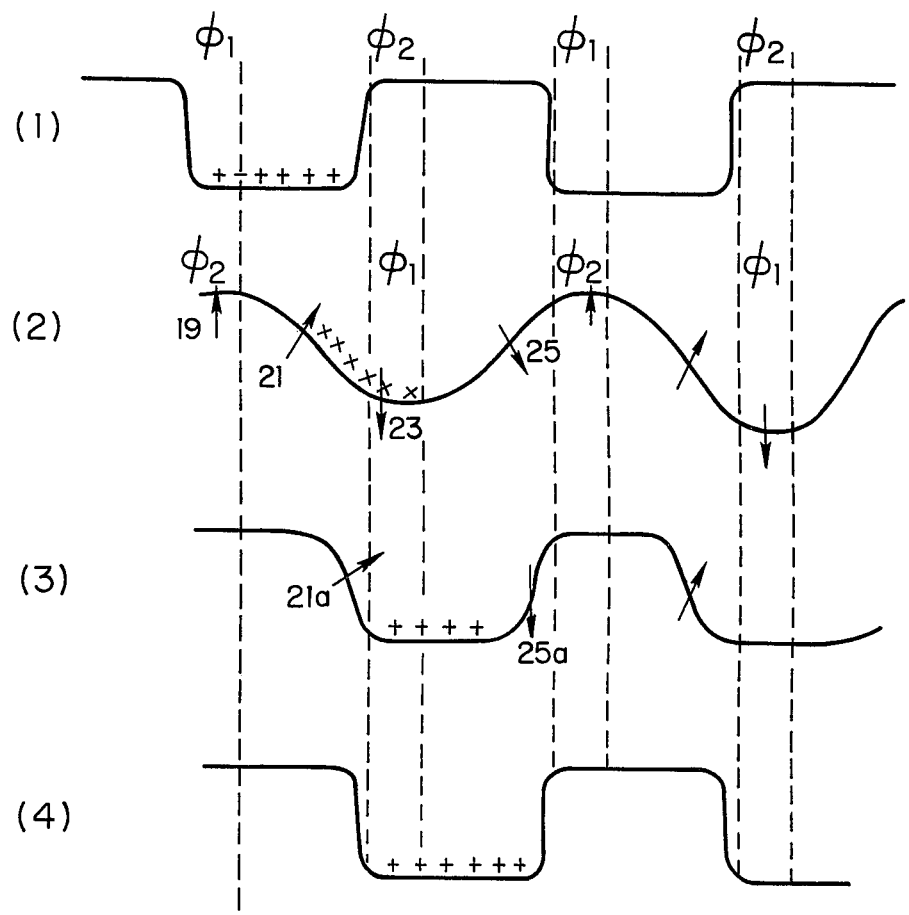
FIG. 2B illustrates the progressive variations of the potential wells under several electrodes during one charge transfer cycle.

The charge transfer operation of the device may be understood by reference to FIG. 2B. The first graph of FIG. 2B illustrates the charge storage mode in which the electrodes 1 and 3 have a voltage in a phase $\phi_1$ applied to them while the electrodes 2 and 4 have applied to them a voltage in a phase $\phi_2$. These phases indicate that the voltage $V_1$ is larger in in magnitude than the voltage $V_2$ so that a deep potential well is created under the odd-numbered electrodes. Charge could thus be stored under electrode 1 or electrode 3. For purpose of illustration, charge is shown as being stored in the potential well under the electrode 1, while under the electrode 3 there is an absence of stored charge. Thus in the illustrated state there is a "1" information bit stored under the electrode 1, while there is a "0" information bit stored under the electrode 3. The graph labeled 2 illustrates the variation in the potential when the voltages on the odd and even electrodes change in phase; i.e., the $\phi_1$ phase is applied to the even numbered electrode, while the $\phi_2$ phase is applied to the oddnumbered electrodes. In other words, the voltages $V_1$ and $V_2$ are instantaneously exchanged. Since the region directly under the highly conductive portion 17a of electrode 11 (in FIG. 2A) includes a very low resistance, the RC time constant of that region will be very small. Consequently the potential 19 in that region will almost instantaneously follow the change in phase of the applied potential, thereby immediately jumping to the value $-V_2$ represented by the phase $\phi_2$. However, the time constant of the distributed RC line composed of the highly resistive region 15a of electrode 11 and the oxide layer immediately beneath that region (in FIG. 2a) will be much larger because of the high resistance involved, typical values of this RC time constant being about 1 $\mu$sec. Thus the potential in the region beneath the highly resistive part 15a will rise to its final $\phi_2$ value very much slower than did the potential under the highly conductive part 17a. In the figure this slower rise is shown as a portion of the well 21, the rise being indicated by an arrow. The portion of the potential well labeled 23 is that potential beneath the conductive region 17b of electrode 12 (in FIG. 2A). When the phase $\phi_1$ is applied to the electrode 12 this part of the potential 23 will also almost instantaneously follow the phase of the applied potential so that there will be created instantaneously a deep potential $(-V_1)$ in this region beneath the conductive part 17b of electrode 12. The direction of change of depth of the region 23 is indicated by a downward arrow in the figure. It can be seen, then, that the charge which was originally stored in the well beneath electrode 11 will be attracted into the region beneath the electrode 12, as shown by the crosses. The part of the potential well 25 (beneath the resistive region 15b of electrode 12 in FIG. 2A) will decrease to the $\phi_1$ value, but will do so slowly. The entire sequence just described also simultaneously occurs with respect to the regions under the electrodes 13 and 14. Thus the potential under the conductive region 17c immediately rises to the $\phi_2$ value while the potential beneath the resistive region 15c rises more slowly, etc. However, since no charge was currently stored under the electrode 13 no charge will be transferred to the region under the electrode 14. This is, of course, equivalent to a "0" bit of information being transferred. The third graph of FIG. 2B illustrates the shape of the potential well later in time as the charge transfer proceeds. It can be seen that the portion of the potential well 21a has risen almost completely to the $\phi_2$ level while the portion of the well 25a has almost decreased to the $\phi_1$ level. Thus the charge that was stored under electrode 11 has almost been entirely transferred to the region under electrode 12.

It can be seen that the charge transfer described above is directional in that, when the phase of the applied voltage is exchanged, charge is transferred in one direction only. The directionality is supplied by the fishtail-like motion of the changing potential well; that is, the slow rising of the region 21 creates an effective potential shoulder which prevents the charge from slipping backwards from the region under electrode 11 to the region under an electrode adjacent to electrode 11 on the left side. Part 4 of FIG. 2B illustrates again the quiescent storage stage in which charge could now be stored under the electrodes 12 and 14. The presence of charge under electrode 12 represents a "1" information bit while the absence of charge stored under electrode 14 represents a "0" information bit.

It can be seen from the above description that the time constant for the charge transfer depends almost entirely on the time constant of the distributed RC line under each of the electrodes. It is thus independent of the clocking frequency of the external voltages, provided only that the frequency is slower than the time constant of the distributed RC lines. Furthermore, as the charge is transferred into the regions under the newly formed deep potential wells, for example, the well under electrode 12, the time constant of the region 25 increases, which serves to decrease the rate at which that portion of the well descends. Thus the rate at which charge will be transferred into this well is itself decreased. This feature of the invention tends to ensure that charge will not be transferred into a region at a high enough rate to force the loss of some charge.

I claim:

1. A semiconductor charge transfer device comprising:
    a substrate layer of a semiconductor material;
    an insulating layer of an insulating material on the substrate layer; and
    an array of electrodes positioned on the insulating layer with an electrically insulating gap between adjacent electrodes, each electrode comprising a first part of a highly conductive material, and a second part of a highly resistive material, the highly resistive part and an associated portion of the insulating layer forming a distributed RC delay line for delaying the response time of an associated region of the substrate to changes in electrical potentials applied to the electrodes, the resulting variation of electrical potential in the substrate serving to impart dynamic directionality to the transfer of charge in said device.

2. A charge transfer device as in claim 1 wherein the highly conductive material of the electrodes is selected from the group consisting of Al, MoAu, and PtTi.

3. A charge transfer device as in claim 1 wherein the highly resistive material of the electrodes is selected from the group consisting of polysilicon and thin metal layers.

4. A charge transfer device as in claim 1 wherein the substrate material is selected from the group consisting of Si, GaAs, and GaP.

5. A charge transfer device as in claim 1 wherein the insulating material of the insulating layer is selected from the group consisting of $SiO_2$, $Si_3N_4$, and $Al_2O_3$.

6. A charge transfer device as in claim 1 including a two phase voltage source electrically interconnected with the array of electrodes, alternate phases of the voltage source being connected with alternate electrodes in the array.

* * * * *